(12) United States Patent
Can (10) Patent No.: US 6,965,266 B1
(45) Date of Patent: Nov. 15, 2005

(54) HIGH VOLTAGE DIFFERENTIAL AMPLIFIER USING LOW VOLTAGE DEVICES

(75) Inventor: Sumer Can, San Jose, CA (US)

(73) Assignee: Intersil America's Inc., Milpitas, CA (US)

( * ) Notice: Subject to any disclaimer, the term of this patent is extended or adjusted under 35 U.S.C. 154(b) by 69 days.

(21) Appl. No.: 10/775,469

(22) Filed: Feb. 10, 2004

(51) Int. Cl.[7] ............................................. H03F 3/45
(52) U.S. Cl. ...................... 330/252; 330/257; 330/258; 330/301; 360/67; 360/68
(58) Field of Search ............................... 330/252, 257, 330/258, 259, 301

(56) References Cited

U.S. PATENT DOCUMENTS

| | | | |
|---|---|---|---|
| 4,766,394 A * | 8/1988 | Yukawa | 330/253 |
| 5,294,892 A * | 3/1994 | Ryat | 330/253 |
| 5,343,164 A * | 8/1994 | Holmdahl | 330/253 |
| 6,181,203 B1 * | 1/2001 | Newlin | 330/257 |

* cited by examiner

Primary Examiner—Peguy Jeanpierre
Assistant Examiner—Khai M. Nguyen
(74) Attorney, Agent, or Firm—Gary R. Stanford (57) ABSTRACT

A high voltage differential amplifier including an input differential pair of low voltage transistors, a sense differential pair of low voltage transistors, first and second high voltage transistors, a low voltage bias transistor, a cascaded pair of low voltage transistors, and an output pair of high voltage transistors. The sense differential pair has a pair of control terminals that detect a common mode voltage of the differential input signal, and establishes a sense node which follows the common mode voltage. The first high voltage device is coupled to the sense node to establish bias node voltage levels which track the common mode voltage, including an output bias node biasing the output pair and a cascade bias node biasing the cascaded pair. In this manner, the terminals of the low voltage devices slide up or down with the common mode voltage and are protected from high voltage levels.

20 Claims, 5 Drawing Sheets

HIGH VOLTAGE DIFFERENTIAL AMPLIFIER USING LOW VOLTAGE DEVICES

BACKGROUND OF THE INVENTION

1. Field of the Invention

The present invention relates to amplifiers, and more particularly to a high voltage differential amplifier implemented using low voltage devices.

2. Description of the Related Art

Server computer systems and the like are often used to support multiple users and/or execute important functions. For many such applications, it is desired that the server remain active to provide continuous and uninterrupted service even during maintenance operations. Maintenance includes repairs, exchanges, upgrades, etc., which should be performed without shutting down the server. Electronic "hot plug" or "hot swap" technology has been developed to meet this need. Hot plug devices and controllers allow boards, disk drives, and other peripherals to be removed and replaced without shutting down system power. Hot plug devices and controllers offer one or more of a variety of features, including electronic circuit breakers, fault isolation, over-current protection, current regulation, UV and over-voltage protection, soft-start functions, fault reporting, etc. Hot plug devices and controllers must be capable of safely switching the voltage levels employed by the underlying computers and peripheral devices while system power is active.

Semiconductor processes continue to develop and have led to smaller feature sizes, higher yields and thus significantly reduced costs. Technological advances have decreased the semiconductor process platforms to sub-micron levels, including the 0.13 micron devices and more recent 90 nanometer (nm) devices. One particular technology is Bipolar Complementary Metal-Oxide Semiconductor (BiCMOS) in which bipolar type devices are implemented using CMOS processes. BiCMOS is a merger of bipolar and CMOS technologies in the same substrate. This merger combines the small feature size of CMOS (which is very advantageous for digital circuits) and substantially all the advantages of bipolar in analog circuits. The advantages include higher precision, good transconductance, good matching and thus low off-set voltages at differential amplifiers, etc. These features make BiCMOS the ideal technology for mixed-signal VLSI (very large scale integration) applications.

It is desired to use the improved semiconductor processes to implement hot plug devices and controllers. Yet hot plug devices and controllers must be capable of switching all voltage levels of the peripheral devices. Although the voltage levels required for signal processing devices and the like have enabled decreased voltage levels from 5 volts (V) to 3.3 V and 2.5 V and even lower, peripheral devices often include older technologies and/or high power devices, which employ higher voltage levels such as 12 V or more. One disadvantage of the newer technologies operable at lower voltage levels is the concomitant reduced level of breakdown voltage. BiCMOS devices, for example, have a breakdown voltage at or near the 6 V level, which are incapable of switching higher voltage levels.

Another technology, called double diffused metal oxide semiconductor (DMOS), is available for high voltage and/or high power applications. A DMOS transistor essentially is a special type of MOS transistor manufactured by making an additional lightly doped diffusion on the drain side of the transistor. The additional diffusion causes the effective channel length to be shorter than drawn length. The additional diffusion increases conductivity so that the DMOS transistor has a lower "on" resistance. The additional, lightly doped region in the channel causes the drain-to-source breakdown voltage to increase, so that it can withstand higher voltages (20–30 V) before it breaks down. Thus, a DMOS transistor can handle larger currents for a given gate voltage, which makes it very suitable for switching applications. DMOS transistors are high voltage devices that are suitable to be used as switches or cascading devices, but are not suitable for signal processing amplification.

It is desired to employ the newer technologies for hot plug devices and components, while also supporting the necessary functions of switching higher voltages levels including 12 V or more.

SUMMARY OF THE INVENTION

A high voltage differential amplifier according to an embodiment of the present invention includes an input differential pair of low voltage transistors, a sense differential pair of low voltage transistors, first and second high voltage transistors, a low voltage bias transistor, a cascaded pair of low voltage transistors, and an output pair of high voltage transistors.

The input differential pair has a pair of control terminals receiving a differential input signal with a common mode voltage, a pair of first current terminals, and a pair of second current terminals coupled together at an input bias node. The sense differential pair has a pair of control terminals receiving the differential input signal, a pair of first current terminals coupled together at a first sense node, and a pair of second current terminals coupled together at a second sense node, where the first and second sense nodes each follow the common mode voltage. The first high voltage transistor has a first current terminal coupled to the second sense node, and a control terminal and a second current terminal coupled together at an output bias node that follows the common mode voltage. The second high voltage transistor has a control terminal coupled to the output bias node, a first current terminal that develops a cascade bias node that follows the common mode voltage, and a second current terminal referenced to a power supply terminal. The low voltage bias transistor has a first current terminal coupled to the first sense node, and a control terminal and a second current terminal coupled together at the cascade bias node. Each transistor of the cascaded pair has a first current terminal coupled to a corresponding second current terminal of the input differential pair, a control terminal coupled to the cascade bias node, and a second current terminal. Each transistor of the output pair has a control terminal coupled to the output bias node, a first current terminal coupled to a corresponding second current terminal of the cascaded pair, and a second current terminal providing a corresponding polarity of a differential output signal.

The high voltage amplifier may further include a differential converter circuit that converts the differential output signal to a single-ended output signal. Each of the low voltage transistors have a breakdown voltage. The input bias node, the pair of first current terminals of the input differential pair, the first and second sense nodes, the output bias node and the cascade bias node each follow the common mode voltage within the breakdown voltage. In this manner, all of the low voltage devices are protected from high voltage input levels. In various embodiments, the low voltage transistors are BiCMOS transistors and the high voltage transistors are DMOS transistors. The BiCMOS transistors handle input signal amplification and the DMOS transistors handle biasing and switching at higher voltage levels. Multiple bias current devices may be included and coupled to the nodes of the differential amplifier. In one embodiment, each bias current device includes a MOS transistor coupled in series with a DMOS transistor and referenced to a power rail.

A high voltage rail-to-rail differential amplifier referenced to a high voltage power supply including positive and a negative terminals according to an embodiment of the present invention includes a high side amplifier circuit and a low side amplifier circuit. The high side amplifier circuit is operative up to the positive terminal of the power supply and the low side amplifier circuit is operative down to the negative terminal of the power supply. Each amplifier circuit may be configured in a similar manner except implemented in a complementary configuration. For example, the differential input pair of the high side may be implemented with NPN bipolar transistors or the like whereas the differential input pair of the low side is implemented with PNP bipolar transistors or the like.

A hot plug device according to an embodiment of the present invention includes a connector including a positive and negative voltage pins, an input reference circuit coupled to the positive and negative voltage pins and providing sense and reference terminals, a pass device having a current terminal coupled to the sense terminal and having a control input, and a differential amplifier having a differential input coupled to the sense and reference terminals, and an output coupled to the control input of the pass device. In the feedback configuration, the differential input develops a common mode voltage. The differential amplifier may be implemented in a similar manner as previously described.

BRIEF DESCRIPTION OF THE DRAWING(S)

The benefits, features, and advantages of the present invention will become better understood with regard to the following description and accompanying drawings in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
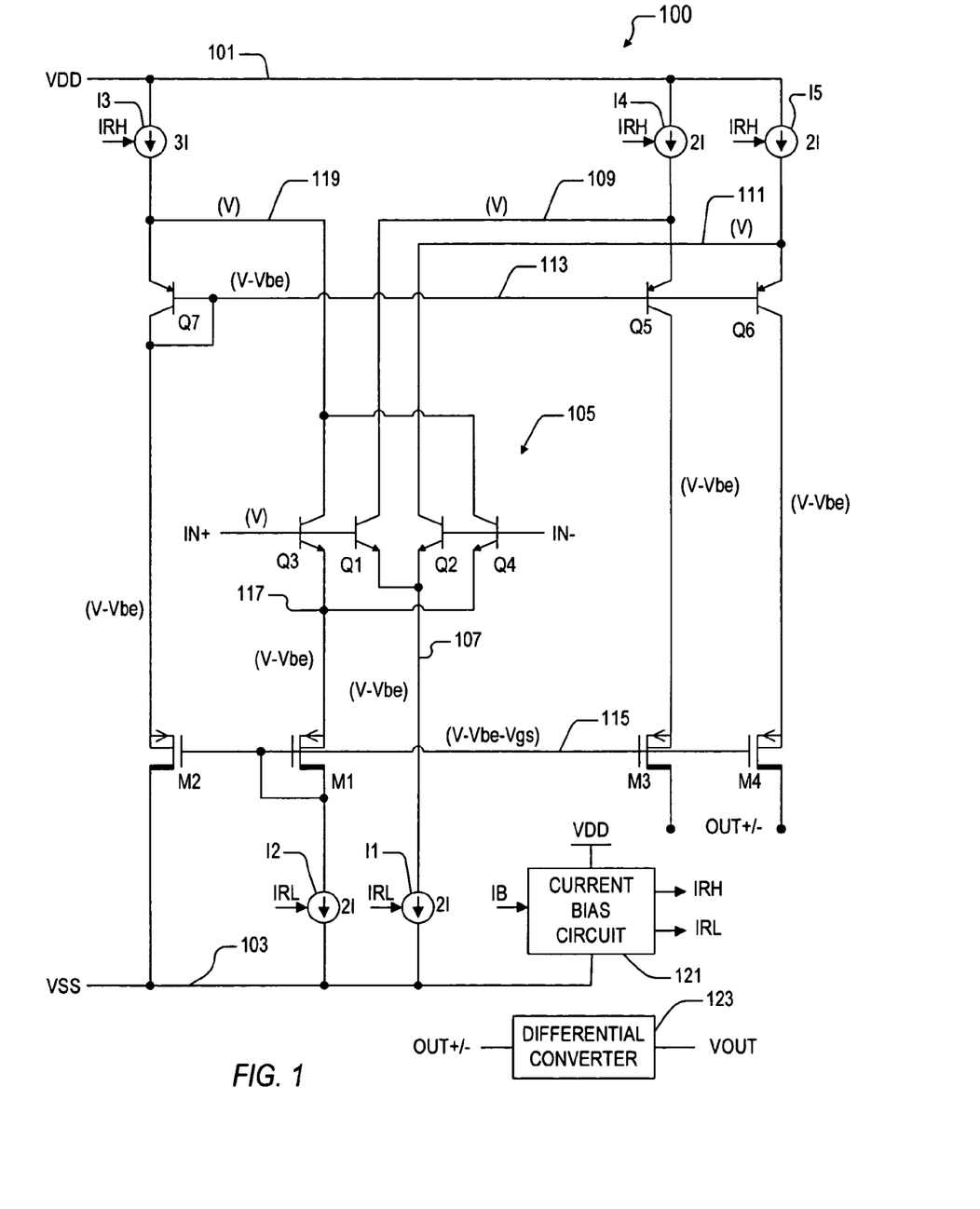
FIG. 1 is a simplified schematic diagram of a differential amplifier implemented according to an exemplary embodiment of the present invention.

FIG. 1 is a simplified schematic diagram of a differential amplifier 100 implemented according to an exemplary embodiment of the present invention. The amplifier 100 receives power via a pair of high voltage rail signals VDD and VSS, where VDD is a positive voltage rail provided on a power supply node or terminal 101 and where VSS is a "negative" voltage rail provided on a power supply node or terminal 103. The difference between the voltages VDD and VSS is a relatively high voltage, such as 12 V or the like. For example, in exemplary embodiments, VDD is +12 V and VSS is ground (e.g., zero V) or −12 V, although other suitable voltage power supply voltage ranges are contemplated.

A differential input stage 105 includes a pair of low voltage NPN bipolar transistors Q1 and Q2 coupled as a differential pair and receiving a differential input signal including positive and negative polarity signals IN+ and IN−, respectively. The IN+ signal is provided to the base of Q1 and the IN− signal is provided to the base of Q2. The emitters of the transistors Q1 and Q2 are coupled together at a common node 107 to an "input" of a current sink I1, which has its "output" coupled to VSS. As used herein, current devices, including current sources and current sinks, have a pair of terminals including an "input" terminal from which current enters the current device, and an "output" terminal through which current flows from the current device. The current sink I1 sinks a current of 2I from node 107, where "I" is a predetermined bias level current further described below. The collector of Q1 is coupled at an amplifier node 109 to an output of a current source I4 and to the emitter of a PNP low voltage bipolar transistor Q5, and the collector of Q2 is coupled at an amplifier node 111 to an output of another current source I5 and to the emitter of another PNP low voltage bipolar transistor Q6. The inputs of the current sources I4 and I5 are coupled to VDD and each sources a current level 2I to the nodes 109 and 111, respectively.

The bases of the transistors Q5 and Q6 are coupled together at a cascade bias node 113. The collector of Q5 is coupled to the source of a P-channel high voltage transistor M3. The collector of Q6 is coupled to the source of another P-channel high voltage DMOS transistor M4. In the embodiments illustrated herein, the high voltage devices are implemented using DMOS technology, although other types of high voltage devices and semiconductor processes are contemplated. In the Figures, the symbol for a DMOS transistor is drawn similar to a MOS transistor except with a thicker drain line. The gates of the transistors M3 and M4 are coupled together at an output bias node 115, and the sources of M3 and M4 provide a differential output signal shown as OUT+/−. A differential converter circuit 123 receives and converts the differential signal OUT+/− into a single-ended output signal VOUT. During steady state operation, the current of 2I from the current source I4 splits at node 109 between Q1 and Q5 and the current 2I from the current source I5 splits at node 111 between Q6 and Q2. The current signals through Q5 and Q6 flow through the high voltage transistors M3 and M4. The IN+/−input signal varies the relative currents through Q1 and Q2, which correspondingly varies the current through the cascaded folding transistors Q5 and Q6 and the output cascade transistors M3 and M4, respectively, to develop the OUT+/−and VOUT output signals as appreciated by those skilled in the art.

The transistors Q1, Q2 and Q5, Q6 are low voltage transistors, such as those implemented using BiCMOS process technology. In the embodiments illustrated herein, the low voltage devices (e.g., low voltage bipolar transistors) are implemented using BiCMOS technology, although other types of low voltage devices and processes are contemplated. The low voltage transistors are shown and described as bipolar transistors, in which the BiCMOS transistors have a relatively low breakdown voltage of approximately 6 V and thus must not be exposed to high voltage levels. In the typical differential configuration, the differential input transistors are exposed to voltage levels at or near the power supply levels, and must therefore be configured as high voltage devices if switching high voltage signals. Higher voltage devices suitable for signal amplification are known, but are relatively large and are made with older semiconductor processes at higher cost and lower yield. The transistors Q1 and Q2, however, are not capable of operating in the full range of the high voltage level across VDD and VSS, and would otherwise breakdown and be damaged without further protection. On the other hand, the transistors M3 and M4 are high voltage devices, such as DMOS devices or the like, and may operate in the full operating range of VDD and VSS voltages. DMOS devices, however, are not suitable for signal amplification but instead are only suitable for high voltage biasing and cascading configurations for switching larger currents and high voltages at the output stage.

A sense differential pair of low voltage bipolar NPN transistors Q3 and Q4 are coupled in parallel with Q1 and Q2, respectively. The base of Q3 is coupled to the base of Q1 and the base of Q4 is coupled to the base of Q2, so that the sense differential pair also receives the differential input signal IN+/−. The emitters of Q3 and Q4 are coupled together at a sense node 117 to the source of a P-channel high voltage DMOS transistor M1. The gate and drain of M1 are coupled together at the output bias node 115, which is further coupled to the input of a current sink I2. The output of current sink I2 is coupled to VSS and sinks a current of 2I from the transistor M1. The gate of M1 is coupled at node 115 to the gate of another P-channel high voltage DMOS transistor M2, which has its drain coupled to VSS and its source coupled to the collector of a low voltage PNP bipolar transistor Q7. The base and collector of Q7 are coupled together (e.g., "diode-coupled") at the cascade node 113. The emitter of Q7 is coupled at another sense node 119 to the collectors of Q3 and Q4 and to the output of another current source I3. The input of the current source I3 is coupled to VDD and it sources a current level of 3I into node 119.

The transistor M1 is "diode-coupled" to develop the voltage level of the output bias node 115 based on the voltage level of the sense node 117. The transistors M1 and M2 are also coupled in a current mirror configuration, where the relative sizes of M1 and M2 are selected so that the current level that flows from source to drain through M1 is twice that of the current that flows from source to drain through M2. A current level of 2I flows through M1 as determined by the current sink I2, which is ultimately sourced by current source I3 via node 119. The balance of current sourced from the current source I3, i.e., 3I−2I=I, thus flows through Q7 and M2 to VSS. The current level 2I splits at node 119 between the transistors Q3 and Q4 and adds at node 117 to source a current level of 2I through M1.

A current bias circuit 121 is provided and is coupled between VDD and VSS. An input bias current IB is used by the current bias circuit 121 to develop bias current reference signals IRH and IRL associated with current level "I" and to set the bias current levels of the current devices I1–I5. The IRL signals are provided to the current sinks I1 and I2 and the IRH signals are provided to the current sources I3–I5. As further described below, the relative sizes of devices in the current bias circuit 121 compared to the devices in the current devices I1–I5 are used to set the current level to a selected multiple of the current level I.

In operation, a common mode voltage V of the differential input signal IN+/− is applied to the bases of the input transistors Q1–Q4. The voltage V is shown in parentheses at the positive input IN+. Assuming that V is sufficiently high to place both of the transistors Q3 and Q4 in their active operating regions, the voltage at node 117 drops only by the base-to-emitter voltage Vbe of the transistors Q3 and Q4, so that the voltage at node 117 is V−Vbe as shown in parenthesis. The voltage Vbe of each of the differential pair of transistors Q3 and Q4 is defined by the expression Vbe=$V_T$ln(IQ3/IQ4), where "ln" denotes the natural logarithm operation, "$V_T$" is the thermal voltage and IQ3 and IQ4 are the relative current through the respective transistors of the differential pair. The thermal voltage $V_T$ is further defined as $V_T$=kT/q, where "T" is temperature in degrees Kelvin, k is Boltzmann's constant, and q is the electronic charge (VT is typically approximately 26 millivolts (mV) at room temperature of 300 degrees Kelvin). The voltage Vbe is substantially the same for each of the differential transistor pair Q1 and Q2. The voltage Vbe typically ranges between 0.5 and 0.9 volts (e.g., 0.6 to 0.7 V), which is well below the breakdown voltage of the low voltage transistors Q1–Q4.

The voltage developed at the sense node 117 is sufficient to cause the transistor M1 to develop the voltage at the output bias node 115 by its gate-to-source voltage Vgs below that of node 117. The voltage of node 115 is shown in parentheses as V−Vbe−Vgs, where Vgs is approximately 1 volt for MOS transistors including DMOS transistors. Thus, the voltage at node 115 is only about 1.5 to 2 V below V, which again is well below the breakdown voltage of the low voltage transistors Q1–Q4. The voltage V−Vbe−Vgs at node 115 is the bias voltage for the output transistors M3 and M4 series-coupled or coupled in cascade configuration with the transistors Q5 and Q6.

The transistor M2 develops its source voltage at the cascade bias node 113 at approximately V−Vbe, which is one Vgs voltage above node 115. The voltage of node 113 at V−Vbe is the bias voltage of the transistors Q5, Q6 and Q7. The voltage from the emitter to base of the transistor Q7 is approximately Vbe, so that the voltage at the sense node 119 is developed to approximately V. In a similar manner, the transistors Q5 and Q6 operate to hold the voltage at nodes 109 and 111, respectively, to approximately V. In this manner, the voltage at the collectors of the transistors Q1–Q4 are approximately at the same voltage level as their bases. As further described below, the current sink I1 is configured to allow the emitters of Q1 and Q2 to float to the voltage level driven by Q1 and Q2. Thus, the emitters of the transistors Q1–Q4 are only Vbe below that of their bases and collectors, so that these transistors are only exposed to relatively small voltage levels in spite of the relatively large potential between VDD and VSS. Since the gates of M3 and M4 are biased at V−Vbe−Vgs, the voltage at their sources is approximately V−Vbe, so that the transistors Q5 and Q6 are only exposed to a voltage differential of approximately Vbe relative to the common mode voltage V, which is within the breakdown voltage of these transistors. A similar situation exists for the low voltage transistor Q7, which sees a voltage drop of approximately Vbe. The voltage level of the differential input signal relative to the common mode voltage V is in the mV range or less and thus is sufficiently small so that the total voltage applied across each of the low voltage transistors remains well below their breakdown voltages.

The sense differential pair of transistors Q3 and Q4 coupled in parallel with the input differential pair of transistors Q1 and Q2 operate as sense devices that detect the input voltage level of IN+/− and produce a suitable bias level for the cascaded folding transistors Q5 and Q6. The voltages appearing at the terminals of the input transistors and the folding transistors thus track or otherwise follow the common mode voltage applied at the input. As a result, the input differential pairs effectively "slide" high or low based on the input voltage variations. This sliding action prevents high voltage drops across any of the low voltage transistors. The collectors of the input differential pair follow their emitters with the varying input voltage levels, so that the voltage drop across the input transistors stays the same while the voltage level of the input signal may vary within the power supply voltage range of VSS to VDD.

The high voltage transistors M1–M4 are not used for input signal amplification but instead are provided in a cascaded configuration and used for high voltage biasing and to switch larger currents at the higher voltage levels. Thus, the lower voltage devices Q1, Q2 and Q5, Q6 are used to sense and amplify the input signal and high voltage handling capability is achieved using the high voltage devices in biasing and cascading configurations for the output stage. A potential limitation of the amplifier 100 is that it is not capable of full rail-to-rail operation. The input transistors Q1 and Q2 can operate all the way up to VDD, but begin to shut off when the common mode voltage is pulled close to the lower voltage rail VSS.

Figure 2:
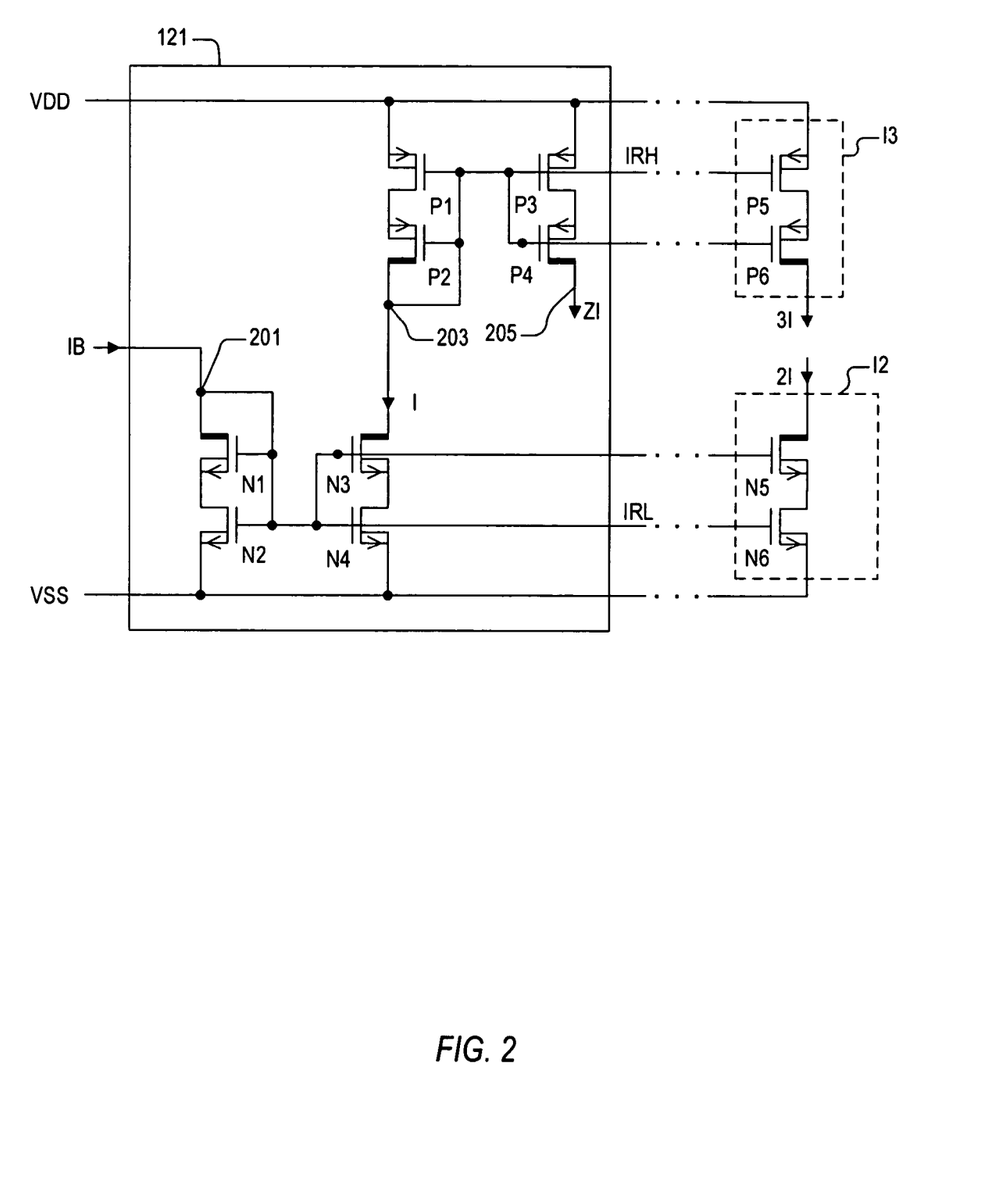
FIG. 2 is a more detailed schematic diagram of an exemplary embodiment of the current bias circuit and of corresponding current devices of FIG. 1.

FIG. 2 is a more detailed schematic diagram of an exemplary embodiment of the current bias circuit 121 and exemplary embodiments of corresponding current devices I2 and I3. The IB current reference signal is provided via a node 201, which is coupled to the gates of N-channel transistors N1, N2, N3 and N4 and to the drain of N1. The lower transistors N2 and N4 are standard or low voltage N-channel MOS transistors and the upper transistors N1 and N3 are higher voltage N-channel DMOS transistors. The source of N1 is coupled to the drain of N2, which has its source coupled to VSS and includes a substrate connection to VDD. The source of N3 is coupled to the drain of N4, which has its source coupled to VSS. The drain of N3 is coupled to a current sink node 203. The relative sizes of the transistors N2 and N4 are selected to define a proportional relationship based on the IB current level so that the drain of N3 sinks a current reference level of "I" from the node 203. Any proportional relationship is contemplated, such as a 1:1 relationship in which IB=I. The higher voltage devices N1 and N3 are coupled in series with the devices N2 and N4, respectively, to allow the nodes 201 and 203 to float to higher voltage levels that might not otherwise be suitable for the devices N2 and N4.

The gate of N2 defines a current reference signal IRL that is used for the current sinks I1 and I2. The current sink I2 is shown, for example, including an N-channel DMOS transistor N5 coupled in series with an N-channel MOS transistor N6. The source of N5 is coupled to the drain of N6, which has its source coupled to VSS. The drain of N5, which is coupled to the drain of M1, sinks a current level of 2I as previously described. In this case, the relative size of N6 determines a 2× relationship to sink twice the reference current level I through the devices N3 and N4. The higher voltage device N5 is provided to allow its drain, coupled to the output bias node 115, to float to higher voltage levels. The current sink I1 is configured in similar manner as the current sink I2 to sink a current level of I from the common node 107 while allowing node 107 to follow the common mode voltage V to high voltage levels.

The current bias circuit 121 includes several P-channel devices P1, P2, P3 and P4 configured in similar manner and referenced to VDD to establish the current reference for the current source devices. The upper transistors P1 and P3 are standard or low voltage P-channel MOS transistors and the series-coupled transistors P2 and P4 are higher voltage P-channel DMOS transistors. Node 203 is coupled to the gates of P1–P4 and to the drain of P2. The sources of P1 and P3 are coupled to VDD. The drain of P1 is coupled to the source of P2 and the drain of P3 is coupled to the source of P4. The drain of P4 at a node 205 sources a proportional current level "ZI", where "Z" is any selected multiple of the current level I determined by the relative size of the transistor P3. The series-coupled device P4 enables the node 205 to float between lower or higher voltage levels while protecting P3.

The gate of P1 defines a current reference signal IRH that is used for the current sources I3–I5. The current source I3 is shown, for example, including a P-channel MOS transistor P5 coupled in series with a P-channel DMOS transistor P6. The source of P5 is coupled to VDD, which has its drain coupled to the source of P6. The drain of P6 sources a current level of 3I to node 119 as previously described. In this case, the relative size of P5 determines a 3× relationship to source three times the reference current level I, while node 119 is allowed to follow the voltage of the common mode voltage V applied at the input. The remaining current sources are configured in similar manner.

Each current mirror circuit (e.g., N1, N2 and N3, N4 or P1, P2 and P3,P4) is similar to a standard MOS current mirror except that the mirror components are not single MOS devices but instead are composite devices formed by coupling a standard MOS device with a DMOS device in series. The current ratios are defined by the standard MOS devices. Each DMOS device acts as a cascade device with its MOS counterpart. The addition of the DMOS transistors provides current mirror high voltage output capacity via the output DMOS collector connection. An advantageous characteristic of the current mirror bias configurations is the DMOS drain connection to operative nodes of the differential amplifier 100. For example, the node 107 coupling the emitters of the transistors Q1 and Q2 together is coupled to a drain of a DMOS transistor of the current source I1. The current source I1 sinks the appropriate current level of I from node 107 and allows node 107 to float to V-Vbe to prevent an over-voltage condition to protect the transistors Q1 and Q2.

Figure 3:
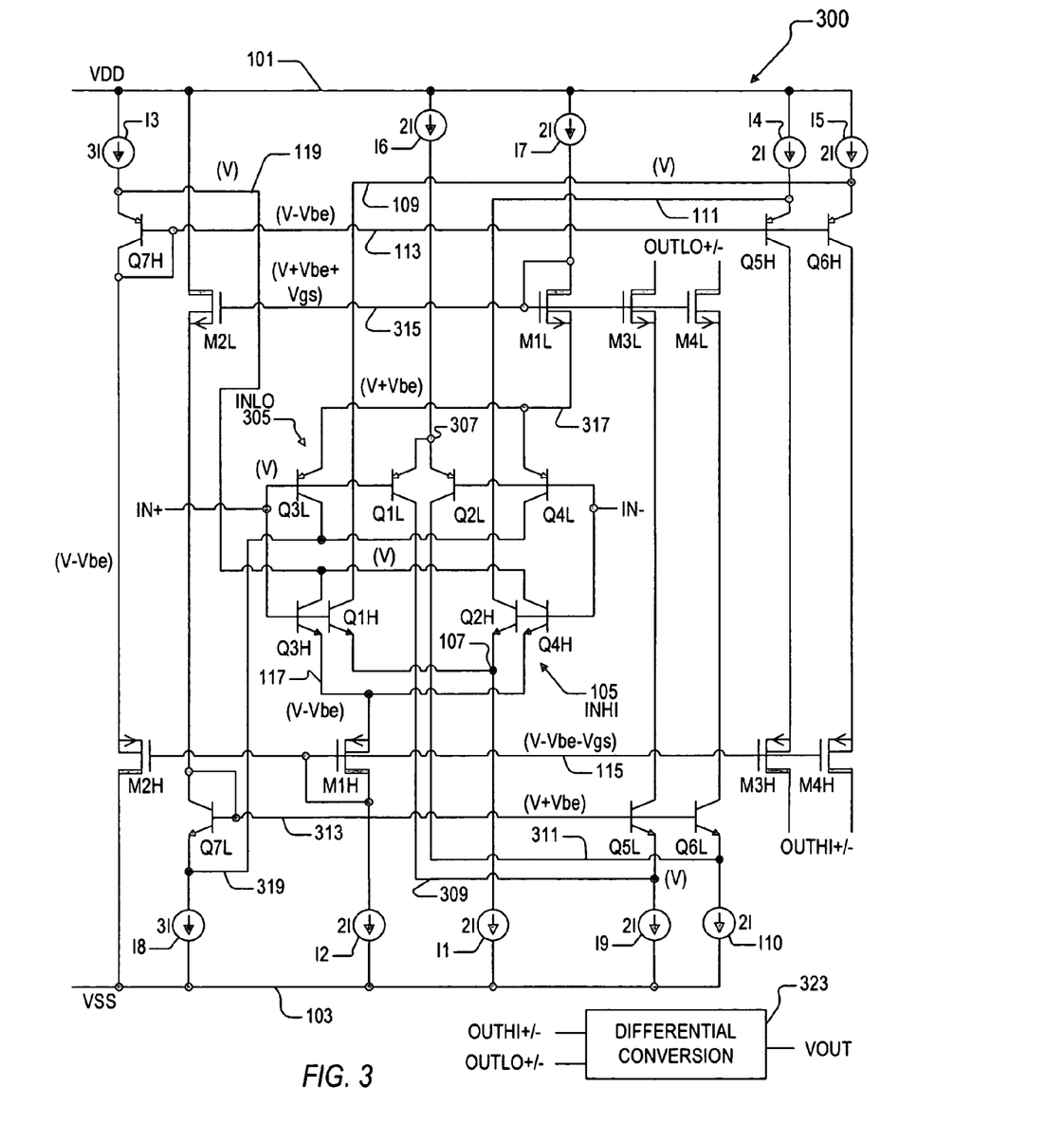
FIG. 3 is a simplified schematic diagram of a differential amplifier implemented according to another exemplary embodiment of the present invention for rail-to-rail operation.

FIG. 3 is a simplified schematic diagram of a differential amplifier 300 implemented according to another exemplary embodiment of the present invention for rail-to-rail operation. The differential amplifier 300 is similar to the differential amplifier 100 in which similar components assume the same or associated reference designators. The differential amplifier 300 includes a high side circuit for handling higher voltage levels up to VDD and a low side circuit for handling lower voltage levels down to VSS. The components of the differential amplifier 100 are substantially repeated to implement the high side circuit. In particular, the transistors Q1–Q7 are included and coupled in the same manner except renamed Q1H–Q7H, where the suffix "H" denotes high side operation. The transistors M1–M4 are also included and coupled in the same manner except renamed M1H–M4H for high side operation. The current devices I1–I5 are included and operate in substantially the same manner. The current bias circuit 121 is included but omitted from the figure to simplify the schematic for clarity. Each of the current devices couple to the current reference signals IRH and IRL as previously described, but these reference signals are also omitted for clarity. The power supply terminals 101 and 103 are included for the VDD and VSS signals, the differential input stage 105 is included for the high side, and the bias nodes 107, 109, 111, 113, 115, 117 and 119 are included. The output signal OUT+/− is renamed OUTHI+/− to denote high side operation.

The differential amplifier 300 includes a low side circuit with low side components that effectively form a dual configuration with the high side circuit. The high side circuit enables operation up to the upper rail VDD, and the low side circuit is configured in a similar and complementary manner to enable operation all the way down to the lower rail VSS. The differential amplifier 300 includes a low side differential input stage 305, which includes a pair of low voltage PNP bipolar transistors Q1L and Q2L coupled as a differential pair and receiving the differential input signal IN+/−. The IN+ signal is provided to the base of Q1L and the IN− signal is provided to the base of Q2L. The emitters of the transistors Q1L and Q2L are coupled together at a common node 307 to an output of a current source I6, which has its input coupled to VDD. The current source I6 sources a current of 2I to the emitters of Q1L and Q2L. The collector of Q1L is coupled at a node 309 to an input of a current sink I9 and to the emitter of a NPN low voltage bipolar transistor Q5L, and the collector of Q2L is coupled at a node 311 to an input of another current sink I10 and to the emitter of another NPN low voltage bipolar transistor Q6L. The outputs of the current sources I9 and I10 are coupled to VSS and each sinks a current level 2I.

The bases of the transistors Q5L and Q6L are coupled together at a cascade bias node 313. The collector of Q5L is coupled to the source of an N-channel high voltage DMOS transistor M3L. The collector of Q6L is coupled to the source of another N-channel high voltage DMOS transistor M4L. The gates of the transistors M3L and M4L are coupled together at an output bias node 315, and the sources of M3L and M4L provide a low side differential output signal OUTLO+/−. During steady state operation, the current of 2I from the current source I6 is split between Q1L and Q2L. The current sink I9 sinks a current level of 2I, so that a current level of approximately 1 flows through M3L and Q5L. The current sink I10 sinks a current level of 2I, so that a current level of approximately 1 flows through M4L and Q6L. The IN+/− input signal varies the relative currents through Q1L and Q2L, which correspondingly varies the current through the folding transistors Q5L and Q6L to develop the OUTLO+/− differential signal. The differential signals OUTHI+/− and OUTLO+/− are provided to a differential conversion circuit 323, which converts the differential signals to a single-ended output signal VOUT.

The transistors Q1L, Q2L and Q5L, Q6L are low voltage transistors, such as those implemented using BiCMOS process technology as previously described. Thus, the transistors Q1L and Q2L are not capable of operating in the full range of the high voltage level across VDD and VSS, and would otherwise be damaged without further protection. The transistors M3L and M4L are high voltage devices similar to the transistors M3H and M4H, such as DMOS devices or the like, and may operate in the full operating range of VDD and VSS voltages.

A sense differential pair of low voltage bipolar PNP transistors Q3L and Q4L are coupled in parallel with Q1L and Q2L, respectively. The base of Q3L is coupled to the base of Q1L and the base of Q4L is coupled to the base of Q2L. The emitters of Q3L and Q4L are coupled together at a sense node 317 to the source of an N-channel high voltage DMOS transistor M1L, having its gate and drain coupled together at the output bias node 315, which is further coupled to the output of a current source I7. The input of current source I7 is coupled to VDD and sources a current of I2 to the transistor M1L. The gate of M1L is coupled at node 315 to the gate of another N-channel high voltage DMOS transistor M2L, which has its drain coupled to VDD and its source coupled to the collector of low voltage NPN bipolar transistor Q7L. The base and collector of Q7L are coupled together (e.g., "diode-coupled") at the cascade bias node 313. The emitter of Q7L is coupled at another sense node 319 to the collectors of Q3L and Q4L and to the input of another current sink I8. The output of the current sink I8 is coupled to VSS and it sinks a current level of 3I from node 319. The transistors M1L and M2L are coupled in a similar manner as the transistors M1H and M2H to develop the voltage levels of the output bias node 315 and the cascade bias node 313. A current of 2I flows through M1L as dictated by current sink I7, splits at node 317 between Q3L and Q4L, and collects at node 319 and flows into current sink I8. The balance of current drawn by the current sink I8, which is a current level of approximately I, flows through the transistors M2L and Q7L to VSS.

The common mode voltage V applied at the input develops a voltage of V+Vbe at sense node 317 and a voltage of V+Vbe+Vgs at the output bias node 315 providing bias voltage for the transistors M1L–M4L. The voltage is dropped to V+Vbe at the cascade bias node 313 via transistor Q7L defining the bias voltage level of the transistors Q5L–Q7L. The voltage at the collectors of the transistors Q1L–Q4L at nodes 309, 311 and 319 develop to approximately V. The voltage at the common node 307 floats down to V+Vbe as controlled by the emitters of the transistors Q1L and Q2L. In this manner, all of the low voltage low side transistors Q1L–Q7L track, or otherwise follow, or otherwise slide up and down with the common mode input voltage and are protected from the high voltage levels between VSS and VDD. The output transistors M3L and M4L are coupled in the cascade configuration to switch higher currents at the higher voltage levels at the output.

Figure 4:
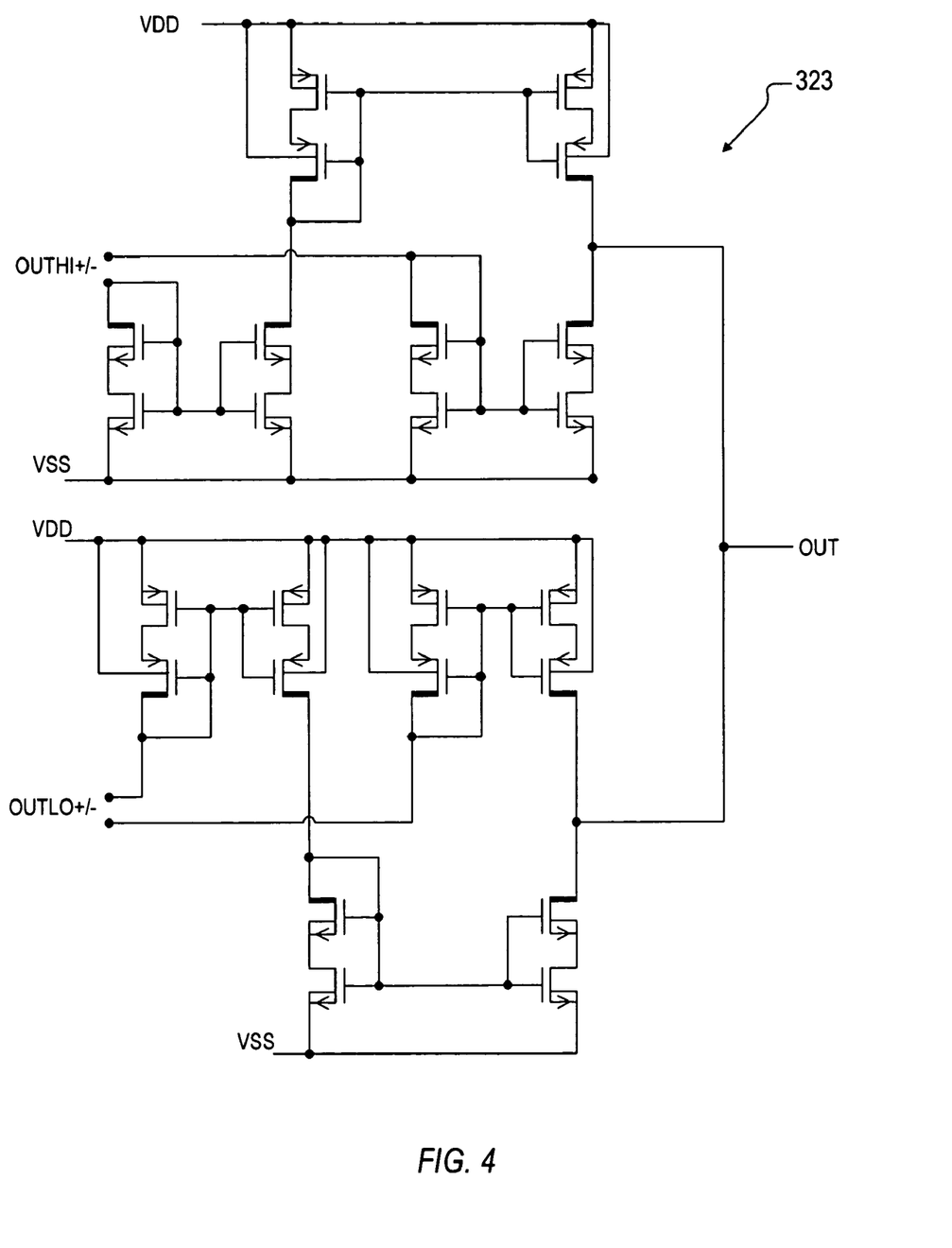
FIG. 4 is a schematic diagram of an exemplary embodiment of the differential conversion circuit of FIG. 3.

FIG. 4 is a schematic diagram of an exemplary embodiment of the differential conversion circuit 323. In this configuration, the circuit 323 is implemented as a current mirror and summing circuit that converts the OUTHI+/− and OUTLO+/− differential outputs to develop the single-ended output signal VOUT as the output of the differential amplifier 300 as known to those skilled in the art. The components and current mirror configurations are similar to that of the current bias circuit 121, and thus is not further described.

Figure 5:
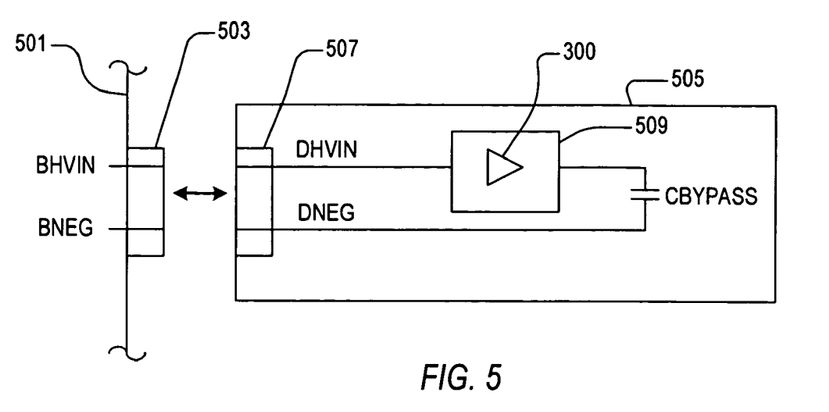
FIG. 5 is a simplified block and schematic diagram illustrating use of the high voltage amplifier of FIG. 3 in a hot-plug peripheral device line card.

FIG. 5 is a simplified block and schematic diagram illustrating use of the high voltage amplifier 300 in a hot-plug peripheral device line card 505. In the illustrated example, a backplane 501 of a computer system includes a backplane connector 503 with a high voltage pin BHVIN and a corresponding negative power pin BNEG (which may be ground). The line card 505 includes a compatible connector 507 including corresponding high voltage and negative pins, DHVIN and DNEG, which are configured to electrically connect to the pins BHVIN and BNEG, respectively, when the connectors 503 and 507 are mated together to plug the line card 505 into the computer system. Line cards typically include one or more power supply filter capacitors. The line card 505, for example, includes a bypass capacitor CBYPASS coupled between the DHVIN and DNEG pins. The CBYPASS capacitor, which is normally discharged prior to connection, otherwise presents a low impedance to the backplane 501 and would otherwise demand a large and sudden inrush current when the line card 505 is plugged into a powered up backplane 501. The sudden high load can cause the power supply of the backplane 501 to collapse, and/or may cause damage to the circuitry on the line card 505 itself, and/or cause damage to other devices electrically coupled to the backplane 501.

The line card 505 includes a hot-plug controller 509 which initially and temporarily isolates power from the CBYPASS capacitor during connection and which limits current to the CBYPASS capacitor to prevent the sudden large load. The hot-plug controller 509 includes and incorporates the high voltage differential amplifier 300 to perform the protection function and enable hot-plug operation. In this manner, the line card 505 may be plugged in and removed while the backplane 501 remains powered.

Figure 6:
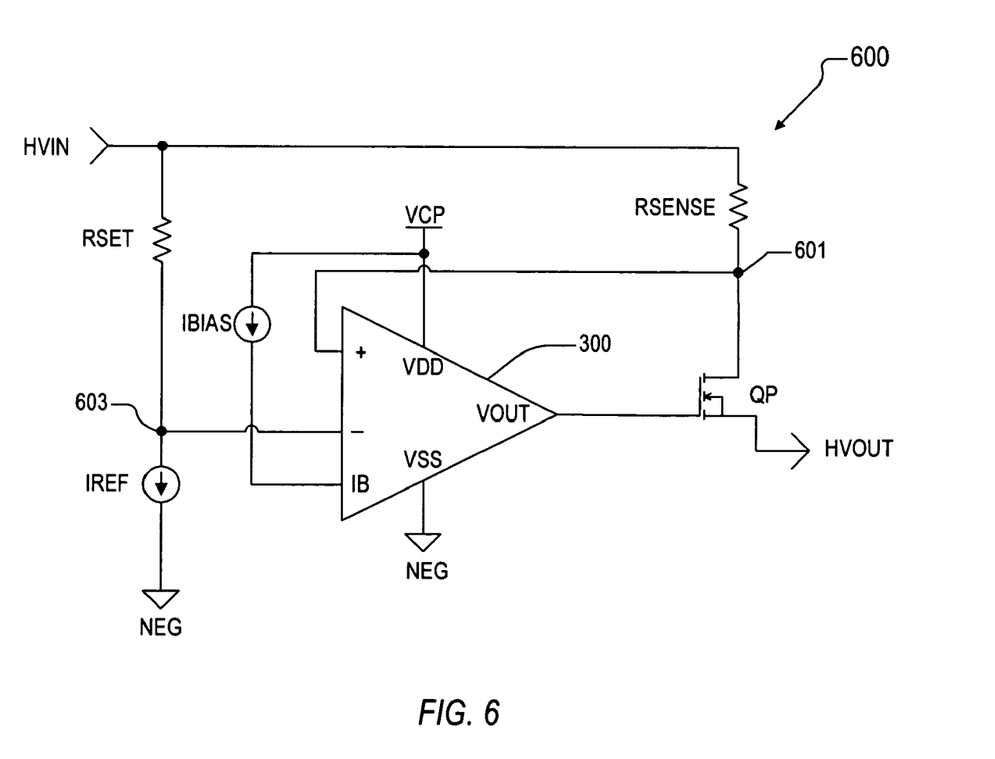
FIG. 6 is a schematic diagram of an exemplary switching circuit employing the high voltage differential amplifier of FIG. 3.

FIG. 6 is a schematic diagram of an exemplary switching circuit 600 employing the high voltage differential amplifier 300. The differential amplifier 300 has its VDD input coupled to a charge pump power source signal VCP, and its VSS input coupled to a negative power rail signal NEG, which may be ground. The VOUT output of the differential amplifier 300 is coupled to the gate of an N-channel FET QP used as a pass device for conveying power from a high voltage input signal HVIN to an output signal VOUT. A high voltage input signal HVIN is coupled to one end of a low value sense resistor RSENSE, having its other end developing a sense node 601, which is coupled to the drain of the FET QP and to the non-inverting or positive input (+) of the amplifier 300. The source of the FET QP develops an HVOUT signal. The HVIN signal is also coupled to one end of an current limit setting resistor RSET, having its other end developing a reference node 603, which is coupled to the inverting or negative input (−) of the amplifier 300 and to an input of a reference current device IREF. The output of the current device IREF is coupled to NEG. A bias current device IBIAS is coupled between VCP and the current reference input IB of the amplifier 300.

As understood by those skilled in the art, the amplifier 300 senses voltage at the HVIN signal and controls the FET QP to limit current to the HVOUT signal to a predetermined maximum level to prevent excessive transients, such as those that would otherwise occur during hot-plugging of devices to the backplane of a computer system. The switching circuit 600 is repeated for every voltage signal needing protection, although the circuit configuration may vary as known to those skilled in the art.

Although the present invention has been described in considerable detail with reference to certain preferred versions thereof, other versions and variations are possible and contemplated. For example, the low voltage devices may be implemented as MOS or FET devices or the like, and the high voltage devices may be implemented with bipolar devices or the like. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A high voltage differential amplifier, comprising:
   an input differential pair of low voltage transistors having a pair of control terminals receiving a differential input signal with a common mode voltage, a pair of first current terminals, and a pair of second current terminals coupled together at an input bias node;
   a sense differential pair of low voltage transistors having a pair of control terminals receiving said differential input signal, a pair of first current terminals coupled together at a first sense node, and a pair of second current terminals coupled together at a second sense node, said first and second sense nodes each following said common mode voltage;
   a first high voltage transistor having a first current terminal coupled to said second sense node, and a control terminal and a second current terminal coupled together at an output bias node that follows said common mode voltage;
   a second high voltage transistor having a control terminal coupled to said output bias node, a first current terminal that develops a cascade bias node that follows said common mode voltage, and a second current terminal referenced to a power supply terminal;
   a low voltage bias transistor having a first current terminal coupled to said first sense node, and a control terminal and a second current terminal coupled together at said cascade bias node;
   a cascaded pair of low voltage transistors, each having a first current terminal coupled to a corresponding one of said pair of second current terminals of said input differential pair, a control terminal coupled to said cascade bias node, and a second current terminal; and
   an output pair of high voltage transistors, each having a control terminal coupled to said output bias node, a first current terminal coupled to a corresponding one of said pair of second current terminals of said cascaded pair, and a second current terminal providing a corresponding polarity of a differential output signal.

2. The high voltage amplifier of claim 1, further comprising a differential converter circuit that converts said differential output signal to a single-ended output signal.

3. The high voltage amplifier of claim 1, wherein said low voltage transistors each have a breakdown voltage, and wherein said input bias node, said pair of first current terminals of said input differential pair, said first and second sense nodes, said output bias node and said cascade bias node each follow said common mode voltage within said breakdown voltage.

4. The high voltage amplifier of claim 1, wherein said low voltage transistors comprise BiCMOS transistors.

5. The high voltage amplifier of claim 1, wherein said high voltage transistors comprise DMOS transistors.

6. The high voltage amplifier of claim 1, wherein said low voltage transistors of said input differential pair and said sense differential pair comprise NPN BiCMOS transistors, wherein said low voltage bias transistor and said low voltage transistors of said cascaded pair comprise PNP BiCMOS transistors, and wherein said high voltage transistors comprise P-channel DMOS transistors.

7. The high voltage amplifier of claim 1, wherein said low voltage transistors of said input differential pair and said sense differential pair comprise PNP BiCMOS transistors, wherein said low voltage bias transistor and said low voltage transistors of said cascaded pair comprise NPN BiCMOS transistors, and wherein said high voltage transistors comprise N-channel DMOS transistors.

8. The high voltage amplifier of claim 1, wherein said low voltage transistors are bipolar transistors, wherein said high voltage transistors are DMOS transistors, wherein said pair of first current terminals of said input differential pair and said first bias node follow said common mode voltage, wherein said input bias node, said second sense node, and said cascade bias node each follow said common mode voltage within a base-to-emitter voltage, and wherein said output bias node follows said common mode voltage within a base-to-emitter voltage plus a gate-to-source voltage.

9. The high voltage amplifier of claim 1, wherein said input bias node, said first sense node, said output bias node and said pair of first current terminals of said differential input pair are each coupled to a corresponding one of a plurality of bias current devices.

10. The high voltage amplifier of claim 9, wherein each of said plurality of bias current devices comprises a MOS transistor coupled in series with a DMOS transistor and referenced to a power rail.

11. A high voltage rail-to-rail differential amplifier referenced to a high voltage power supply including positive and a negative terminals, comprising:
   a high side amplifier circuit operative up to the positive terminal of the power supply; and
   a low side amplifier circuit operative down to the negative terminal of the power supply; and
   wherein each said amplifier circuit comprises:
      an input stage including an input differential pair of low voltage transistors having input terminals receiving a differential input signal with a common mode voltage, a common terminal and a pair of amplifier terminals;
      a bias sense stage including a sense differential pair of low voltage transistors having input terminals receiving said differential input signal, and current terminals coupled to form first and second sense nodes that slide with said common mode voltage;
      a pair of high voltage transistors forming an output bias stage having a first current terminal coupled to said second sense node, a diode-coupled terminal forming an output bias node that slides with said common mode voltage, and a second current terminal forming a cascade bias node that slides with said common mode voltage;
      a low voltage bias transistor diode-coupled to said cascade bias node and having a current terminal coupled to said first sense node;
      a cascade stage including a cascaded pair of low voltage transistors having current terminals coupled in cascade with said amplifier terminals of said input differential pair and control terminals coupled to said cascade bias node; and
      an output stage including a pair of high voltage transistors having control terminals coupled to said output bias node and current terminals coupled in series with said cascade stage to provide a differential output signal.

12. The high voltage rail-to-rail differential amplifier of claim 11, wherein said low voltage transistors each have a breakdown voltage, and wherein said common terminal, said pair of amplifier terminals, said first and second sense nodes, said output bias node and said cascade bias node each slide with said common mode voltage within said breakdown voltage.

13. The high voltage rail-to-rail differential amplifier of claim 11, wherein said low voltage transistors comprise BiCMOS transistors.

14. The high voltage rail-to-rail differential amplifier of claim 11, wherein said high voltage transistors comprise DMOS transistors.

15. The high voltage rail-to-rail differential amplifier of claim 11, wherein said low voltage transistors of said input stage and said bias sense stage of said high side amplifier circuit and wherein said low voltage transistors of said cascade stage and said low voltage bias transistor of said low side amplifier circuit each comprise NPN BiCMOS transistors, wherein said low voltage transistors of said input stage and said bias sense stage of said low side amplifier circuit and wherein said low voltage transistors of said cascade stage and said low voltage bias transistor of said high side amplifier circuit each comprise PNP BiCMOS transistors, wherein said high voltage transistors of said high side amplifier circuit comprise P-channel DMOS transistors, and wherein said high voltage transistors of said low side amplifier circuit comprise N-channel DMOS transistors.

16. The high voltage rail-to-rail differential amplifier of claim 11, wherein said low voltage transistors are bipolar transistors, wherein said high voltage transistors are DMOS transistors, wherein said first bias node and said amplifier terminals each slide at approximately the same voltage as said common mode voltage, wherein said common terminal, said second sense node and said cascade bias node each slide relative to said common mode voltage within a base-to-emitter voltage, and wherein said output bias node slides relative to said common mode voltage within a base-to-emitter voltage plus a gate-to-source voltage.

17. The high voltage rail-to-rail differential amplifier of claim 11, wherein said common terminal and said pair of amplifier terminals of said input stage, said output bias node and said first sense node are each coupled to a corresponding one of a plurality of bias current devices.

18. The high voltage rail-to-rail differential amplifier of claim 17, wherein each of said plurality of bias current devices comprises a MOS transistor coupled in series with a DMOS transistor and referenced to a corresponding one of said positive and negative power terminals.

19. A hot plug device, comprising:
   a connector including a positive and negative voltage pins;
   an input reference circuit coupled to said positive and negative voltage pins and providing sense and reference terminals;
   a pass device having a current terminal coupled to said sense terminal and having a control input; and
   a differential amplifier having a differential input coupled to said sense and reference terminals and an output coupled to said control input of said pass device, said differential input developing a common mode voltage, said differential amplifier comprising:
      an input differential pair of low voltage transistors having a pair of control terminals coupled to said differential input, a pair of first current terminals, and a pair of second current terminals coupled together at an input bias node;
      a sense differential pair of low voltage transistors having a pair of control terminals coupled to said differential input signal, a pair of first current terminals coupled together at a first sense node, and a pair of second current terminals coupled together at a second sense node, said first and second sense nodes each following said common mode voltage;
      a pair of high voltage transistors forming an output bias stage having a first current terminal coupled to said second sense node, a diode-coupled terminal forming an output bias node that follows said common mode voltage, and a second current terminal forming a cascade bias node that follows said common mode voltage;

a low voltage bias transistor having a first current terminal coupled to said first sense node, and a control terminal and a second current terminal coupled together at said cascade bias node;

a cascaded pair of low voltage transistors, each having a first current terminal coupled to a corresponding first current terminal of said input differential pair, a control terminal coupled to said cascade bias node, and a second current terminal;

an output pair of high voltage transistors, having a pair of control terminals coupled to said output bias node, a pair of first current terminals coupled to a corresponding one of said second current terminals of said cascaded pair, and a pair of second current terminals providing a differential output signal; and a differential conversion circuit that converts said differential output signal to said differential amplifier output.

20. The hot plug device of claim 19, wherein said low voltage transistors comprise BiCMOS transistors and wherein said high voltage transistors comprise DMOS transistors.

* * * * *